United States Patent [19]

Marek

[11] 3,771,027

[45] Nov. 6, 1973

[54] BISTABLE SEMICONDUCTOR DEVICE

[75] Inventor: Alois Marek, Nussbaumen, Switzerland

[73] Assignee: Brown, Boveri & Company Limited, Baden, Switzerland

[22] Filed: Nov. 1, 1971

[21] Appl. No.: 194,403

[30] Foreign Application Priority Data

Nov. 2, 1970 Switzerland ........................ 16184/70

[52] U.S. Cl. ...... 317/235 R, 317/234 G, 317/234 B, 317/235 AB

[51] Int. Cl. ............................................ H01l 11/10

[58] Field of Search ............................. 317/235, 234

[56] References Cited

UNITED STATES PATENTS

| | | | |
|---|---|---|---|
| 3,509,339 | 6/1971 | Bilo | 317/235 |
| 3,337,783 | 8/1967 | Stehney | 317/235 |
| 3,579,060 | 5/1971 | Davis | 317/235 |
| 3,599,061 | 8/1971 | Kokosa | 317/235 |
| 3,577,042 | 5/1971 | Roach | 317/235 |
| 3,513,367 | 5/1970 | Wolley | 317/235 |

*Primary Examiner*—John W. Huckert
*Assistant Examiner*—E. Wojciechowicz
*Attorney*—Wolfgang G. Fasse

[57] ABSTRACT

The present bistable semiconductor device has at least three junctions. At least one of the outer junctions is interrupted by short circuit means hereafter referred to as shorting areas on simply shortings which extend, preferably as narrow strips, through the semiconductor zone located adjacent to main electrode means of the device, whereby the shorting areas extend substantially in parallel to the direction of propagation of the conductive state which starts at and extends from a gate electrode in response to a control pulse applied to said gate electrode.

14 Claims, 4 Drawing Figures

BISTABLE SEMICONDUCTOR DEVICE

BACKGROUND OF THE INVENTION

The present invention relates to a bistable semiconductor device or circuit element having at least three junctions. It is known in these devices to provide short circuiting in predetermined areas of at least one of the outer junctions by means of galvanic contacts between the adjacent inner semiconductor zone and the respective main electrode, thus providing a shunt path around or through the emitter zone.

The shorting areas, which for example connect the inner semiconductor zone such as a p-base zone with the respective main electrode such as the cathode are known as so called emitter shortings. Reference is made in this connection to U.S. Pats. Nos. 3,337,783 and 3,337,782. These shorting areas improve the maximum rated voltage slop (dv/dt) because the charging for establishing the forward depletion layer is conducted directly to the electrode. The dependency of the breakover voltage as a function of temperature is also improved because the static off-state current is conducted past the emitter-pn-junction and directly to the respective electrode, for example the cathode. Thus, in both instances an injection of the emitter due to these undesired currents is avoided.

German Patent Publication 1,539,630 discloses a reversely conducting thyristor in which emitter shortings are provided for the cathode side of the device as well as for the anode side.

As described in "Scientia Electrica", Vol. XII (1966) No. 4, p. 120, emitter shortings are effective only if the ohmic transversal sheet resistance through the base zone to the shorting electrode is small relative to the resistance of the pn-junction. This condition becomes even more critical the larger the area of the semiconductor device or element, especially in connection with power thyristors. Accordingly, in such large area elements the shortings are evenly distributed over the entire emitter zone in the form of small shorting areas.

However, such an embodiment with an even distribution of small shorting areas has the disadvantage that the shorting areas interrupt the propagation front of the conducting state (on-state) of the device which spreads starting from a control electrode over the entire element. In other words, these shorting areas divert or stop the propagation and thus impede entirely the fast propagation. As a result, the cirtical rate-of-rise of the on-state current (di/dt) is impaired.

OBJECTS OF THE INVENTION

In view of the foregoing, the invention aims at achieving the following objects, singly or in combination:

- to remove the above outlined drawbacks of the prior art, especially to avoid an impairment of the di/dt characteristic;
- to arrange the above mentioned shorting areas in such a manner that they will facilitate or at least not impede or impair the rapid propagation of the on-state;
- to construct semiconductor devices or elements in such a manner that an efficient cooling is achieved with due regard to the distribution of said shorting areas;
- to provide means for the cooling of the semiconductor device which will operate in the manner of a so called heat pipe; and
- to eliminate or reduce substantially the so called impeding or detouring as well as "splitting" effects of the shorting areas relative to the propagation of the on-state of the semiconducotr device.

SUMMARY OF THE INVENTION

According to the invention, there are provided semiconductor devices which have shorting areas between an inner semiconductor zone and the respective adjacent main electrode for short circuiting the corresponding junction in predetermined areas which are formed as narrow longitudinal strips the sides of which extend in parallel to the direction of propagation of the conducting state of the semiconductor device, said direction being determined by the geometric arrangement and the structural formation of a control or gate electrode and the respective main electrode or electrodes and wherein the propagation of the conductive state is initiated by a control pulse applied to said control electrode.

Said shorting areas may be provided with regard to one of the main electrodes or with regard to both of the main electrodes; namely, the cathode as well as the anode electrode.

Further, according to the invention, in a preferred embodiment the main electrodes are made of a metal which is a good electrical and thermical conductor and the electrodes are shaped in such a manner that they have a relatively large thickness in register with the above mentioned shorting areas, whereas a relatively small electrode thickness is in register with the adjacent emitter zone or zones. By giving the main electrodes the just described shape or configuration, it is possible to cool the semiconductor device or element in an advantageous manner especially when it is part of an integrated system, whereby the cooling may be accomplished preferably by the so called heat pipe technique.

BRIEF DESCRIPTION OF THE DRAWINGS

In order that the invention may be clearly understood, it will now be described, by way of example, with reference to the accompanying drawings, wherein.

DETAILED DESCRIPTION OF PREFERRED EMBODIMENTS

Figure 1:
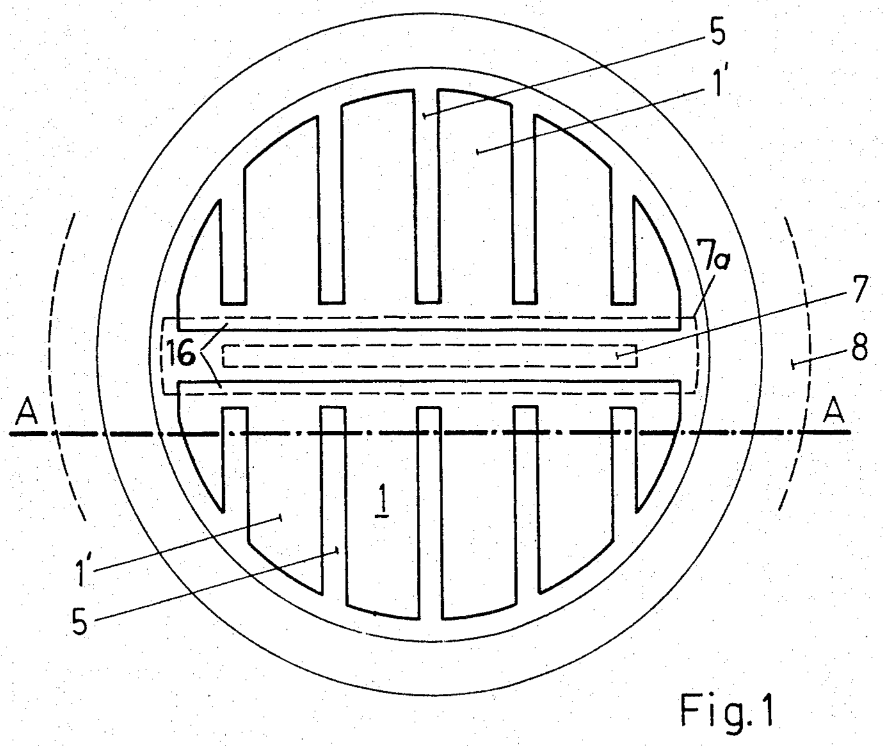
FIG. 1 is a schematic top view onto a semiconductor device embodying the present invention, whereby the main electrode member has been omitted so as not to obscure the view of the shorting areas which extend in parallel to each other and perpendicularly relative to a longitudinal strip or bar shaped gate electrode.
Figure 2:
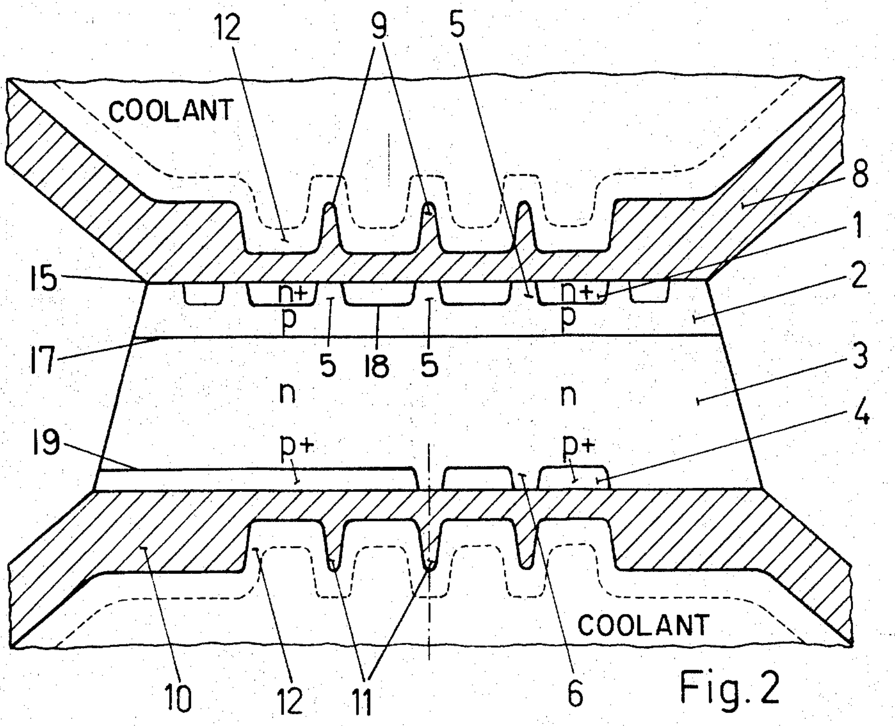
FIG. 2 shows a sectional view along the section line AA in FIG. 1, but now including the main electrode and actually illustrating two embodiments, one embodiment is shown in the left-hand half wherein emitter shortings are provided only on the upper cathode side, the other embodiment is shown in the right-hand half wherein emitter shorting areas are provided on the upper cathode side and on the lower anode side.

FIG. 1 is a top view onto a plane extending along a line 15 shown in FIG. 2 and perpendicularly to the plane of the drawing sheet. The upper main electrode member such as the cathode 8 shown in FIG. 2 is thus only indicated partially in phantom lines in FIG. 1 in order to clearly show the shape of the emitter zone 1 which comprises two comb shaped members 1′ having teeth or strip shaped emitter zone portions separated from each other along their length by shorting areas 5 and interconnected at one end thereof by a lateral portion 16. The emitter zones or rather their lateral portions 16 are separated from each other to provide space therebetween for locating a gate electrode 7 in an opening 7a of the cathode 8.

As seen in FIG. 2, the semiconductor device comprises the above mentioned emitter zone 1 made of n-conducting semiconductor material. The emitter zone 1 is followed by a p-conducting base zone 2 which in turn is followed by an n-conducting base zone 3 and a p-conducting emitter zone 4. The just mentioned zones are sandwiched between two main electrode members comprising the cathode electrode 8 and the anode electrode 10. Thus, there are formed three junctions between zones of different conductivity type. An inner junction 17 is formed between the two base zones 2 and 3. An outer junction 18 is formed between the emitter zone 1 and the base zone 2 whereas a further outer junction 19 is formed between the base zone 3 and the emitter zone 4. The spacings between the teeth of the emitter zone 1 adjacent to the cathode electrode 8 are filled with shorting areas 5 of the base zone 2 which thus act as so called emitter shortings. The gate electrode 7 is formed as a strip or bar which extends in parallel to the lateral portions 16 of the adjacent emitter zone members 1′. The gate electrode 7 extends perpendicularly to the longitudinal extension of said short circuiting areas 5.

As seen in the right-hand half of FIG. 2, the emitter zone 4, adjacent to the anode electode 10, may be interrupted by shorting areas 6 filled by the semiconductor material of n-conductivity type forming the base zone 3. In the other embodiment shown, for simplicity's sake, in the left-hand half of FIG. 2, emitter zone 4 may be uninterrupted, that is, no emitter shortings at all are provided in the emitter zone 4. If the emitter zone 4, adjacent to the anode 10 is interrupted, the bistable semiconductor device will be reversely conducting. However, if the emitter zone is uninterrupted, the semiconductor device will be blocking in the reverse direction.

In the reversely conducting device the forward voltage will be reduced or may be reduced by giving the emitter zones 4, adjacent to the anode 10, a shape which is congruent to the shape of the emitter zones 1, adjacent to the cathode 8, and by registering these congruent shapes or emitter zones with each other, whereby the shorting areas 5 and 6 will also be in register with each other.

The cathode and anode electrodes 8 and 10 are provided with ridges 9 and 11 respectively. These ridges provide thicker electrode portions which are separated from each other by valleys in register with thinner electrode portions. The position of these ridges and valleys is such that the ridges 9 are in register with the shorting areas 5, whereas the ridges 11 are in register with the shortings 6. On the other hand, the valleys between the ridges 9 are in register with the emitter zone 1, whereas the valleys between the ridges 11 are in register with the emitter zone 4. This arrangement is especially advantageous because it facilitates the cooling of the semiconductor device due to the fact that the dissipation heat is generated substantially only in the areas of the emitter pn-junctions of the semiconductor element, that is, at the junctions 18 and 19. Moreover, this construction of the main electrode means 8 and 10 results in an especially small thermal transfer resistance especially if the outer surfaces of the electrodes 8 and 10 are brought into direct contact with a coolant.

Yet another advantage of the just described construction of the electrodes 8 and 10 is seen in that the increased thickness provides good transversal electrical conductivity toward the laterally extending electrical connection means (not shown). Besides, these ridges substantially increase the mechanical stability of the entire device.

As mentioned above, the lateral portions 16 of the emitter zone 1 separate the shortings 5 from the gate electrode or zone 7. Thus, insulation is provided in the area where the shortings 5 extend closest to the gate electrode 7 in order to avoid a direct short circuit between the gate electrode 7 and the cathode 8 through the base zone 2.

In order to increase the cooling efficiently still further, the invention suggests to cover the outside surface of the electrodes 8 and 10 along its ridges and valleys with a capillary structure which provides a uniform cooling over the entire surface of these electrodes in accordance with the so called heat pipe technique. Reference is made in this connection to "New Scientist," March 5, 1970, p. 461. The capillary structure, may, for example, be a layer 12, of porous tungsten which has been deposited on the surfaces of the electrodes 8 and 10 from a volatilized phase. Briefly, the heat pipe technique involves the vaporization of a liquid coolant in the area of the electrodes 8 and 10 to be cooled, The vapor is then again condensed in a cooler region (not shown) whereby the capillary forces in the capillary structure of the layer 12 assure a recirculation of the liquid coolant to the electrodes 8 and 10 to be cooled.

If a positive voltage is applied to the gate electrode 7, the conducting state will be propagated along the areas or zones of the semiconductor device between the gate electrode 7 and the emitter zone 1. The propagation front must then extend or move perpendicularly to the longitudinal direction of the gate electrode 7 and outwardly over the entire emitter zone 1. It is a special advantage of the invention that the just mentioned spreading of the propagation front of the conducting state is accomplished very rapidly due to the fact that the strip shaped shortings 5 extend in parallel to the direction of movement of the propagation front.

Figure 3:
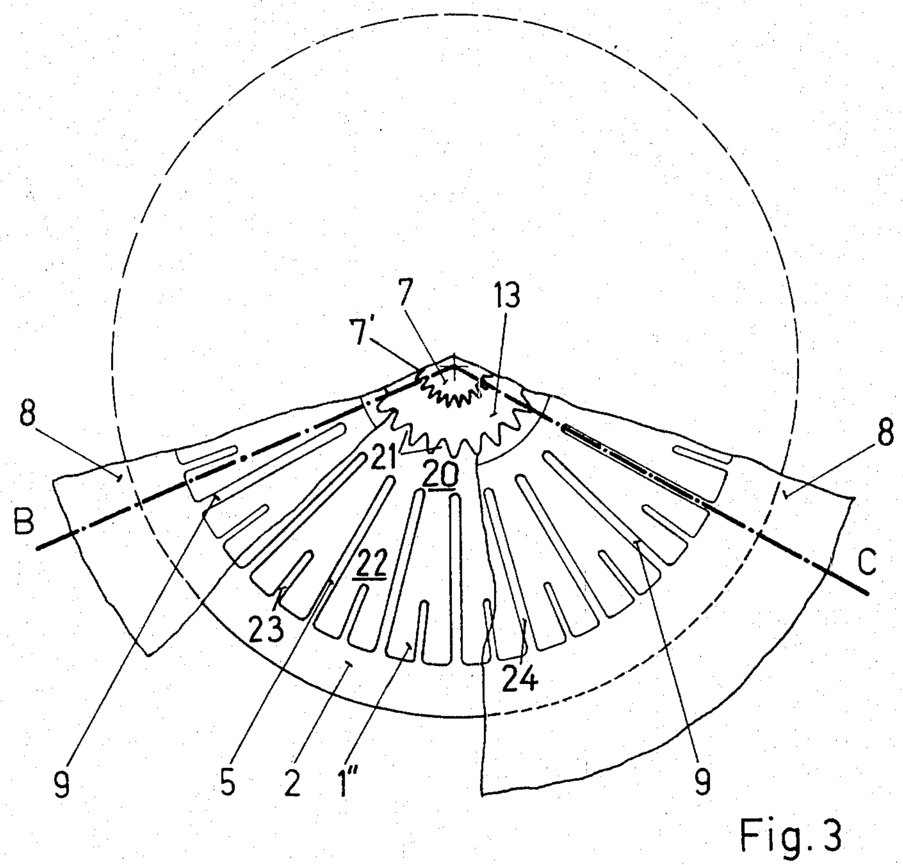
FIG. 3 illustrates a top view onto another embodiment according to the invention partially in section having a centrally located gate electrode with a serated periphery and shorting areas extending radially outwardly relative to said central control electrode.
Figure 4:
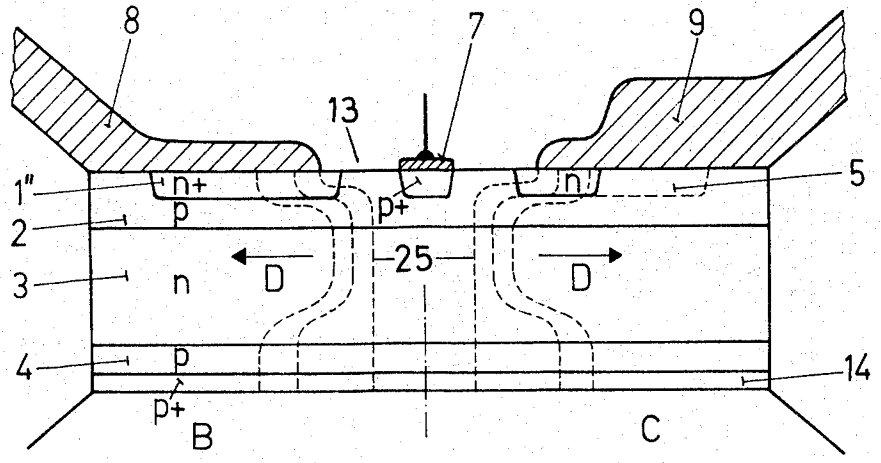
FIG. 4 illustrates sectional views of FIG. 3 whereby to the left of the vertical center line in FIG. 4 the section illustrates a view along line B in FIG. 3 whereas the view to the right of the vertical center line of FIG. 4 illustrates the section along line C in FIG. 3.

FIGS. 3 and 4 illustrate a semiconductor device according to the invention, the elements of which are arranged with axial or rotational symmetry relative to each other, and which corresponds in its basic conception and with regard to the nomenclature and reference numerals to the semiconductor device according to FIGS. 1 and 2.

The gate electrode 7 of the embodiment according to FIGS. 3 and 4 is arranged in the center of an emitter annulus 1′′ within an aperture 13 in the cathode 8. For simplicity's sake, the background of the cathode 8 is not shown in FIG. 4. The gate electrode 7 is in contact with the p-base zone 2, which is perferably doped higher underneath the electrode 7 as indicated at $p^+$ in a disk shaped region whereby the electrical transition is improved as is well known. Said disk shaped region is laterally surrounded by said emitter annulus and, preferably has a serated periphery with teeth 7' extending radially outwardly. The emitter annulus 1'' has an inner ring portion 20 surrounding said disk shaped region. The ring portion 20 is also serated with teeth 21 pointing radially inwardly toward said disk shaped region. The teeth 7' as well as the teeth 21 have spacings therebetween and the arrangement is such that the teeth 7' face the teeth 21 while the spacings between the teeth also face each other. Further, the spacings between the teeth are radially aligned with radially extending slots in the annulus 1'' through which said narrow strip shortings 5 extend into contact with the electrode 8. The teeth are radially aligned with the semiconductor lands 22 between adjacent slots or short circuit strips 5. The cathode 8 has a serated inner edge as the emitter annulus 1''. The gate electrode 7 has a serated outer edge as the respective disk shaped region.

The shorting strips 5 extend radially outwardly away from the gate electrode 7 or said region respectively, and are constituted by the semiconductor material of the base zone 2. The inner ends of these strips 5 are separated or insulated from the control electrode 7 by said inner ring portion 20 of the emitter annulus 1''.

The just described positioning of the teeth and spaces between the teeth relative to each other achieves the advantage that the firing or the beginning of the on-state starts in a defined manner in the areas of said teeth and is then guided into the lands 22 of the emitter annulus 1'' which extend between adjacent radially extending shorting strips 5. If desired, these lands 22 may be provided with further slots 23 also extending radially outwardly in a peripheral zone of said emitter annulus. Further shorting strips of the base zone 2 may extend through the slots 23 into contact with said electrode 8 the upper surface of which is provided with said ridges 9 positioned to register with said strips 5. Further, shorter ridges 24 may be provided on the upper surface of the electrode 8 in positions for registering with said slots 23 in the emitter annulus 1''. The ridges 9 and 24 extend radially inwardly toward said aperture 13. The geometrical arrangement of the semiconductor device illustrated in FIGS. 3 and 4 has also the advantage that the so called delay effect, the diverting effect, and/or the so called splitting effect, which effects are the result of the interaction between the propagating front of the conducting state with the edges of the shorting areas, are also much smaller than in the prior art semiconductor devices wherein said short circuit areas are distributed over the entire emitter surface.

Referring to FIG. 4, the dashed lines 25 represent the electrical current path as it appears shortly after the conducting or on-state of the semiconductor device has been initiated by a control pulse applied to the gate electrodes 7. Initially, the current lines 25 between the layer 14 adjacent to the anode electrode (not shown) and the emitter annulus 1'' adjacent to the cathode electrode 8, are accumulating in the space or range below the gate electrode 7. However, thereafter, the propagation front of the conducting state advances radially outwardly in the direction of the arrows D until the current lines 25 are distributed over the entire active surface. According to the invention the shorting strips 5 and 23 extend in parallel to said direction D of propagation so that, as described, the propagation advances rapidly.

Incidentally, the figures are drawn on an exaggerated scale for clarity. Thus, for example, the ribs 9 including the width of the electrode under the ribs may have a height of about 1mm. The width of a rib may be, for example, 0.1mm.

Although the invention has been described with reference to specific example embodiments, it is to be understood, that it is intended to cover all modifications and equivalents within the scope of the appended claims.

What is claimed is:

1. A semiconductor device having a non-conducting and a conducting state, comprising main electrode means made of a metal of good electrical and thermal conductivity including first and second electrode members, inner and outer semiconductor zones of differing conductivity types arranged intermediate said main electrode members for defining at least three junctions therebetween including an inner junction and two outer junctions, narrow strip shorting means extending through at least one of said outer junctions to provide galvanic contact in defined strip areas between at least one of said electrode members and the respective, adjacent inner semiconductor zone, whereby the same electrode member contacts both the inner and outer zones simultaneously, a gate electrode arranged for cooperation with said main electrode members to define a direction of propagation of said conducting state which starts at said gate electrode in response to a control pulse applied thereto, said narrow strip shorting means having longitudinal sides extending substantially in parallel to said direction of propagation, said electrode means further comprising outwardly extending ridges positioned to register with said narrow strip shorting means and valley bottoms between the ridges positioned to register with said semiconductor means, whereby the thickness of said ridges is larger than the thickness of said valley bottoms.

2. The semiconductor device according to claim 1, wherein said gate electrode comprises a longitudinal bar, said semiconductor means comprising emitter zones interconnected by a lateral emitter portion extending in parallel to said longitudinal bar of the gate electrode, said shorting means extending between its respective emitter zones and perpendicularly relative to said longitudinal bar of the gate electrode as well as perpendicularly to said lateral emitter portion.

3. The semiconductor device according to claim 2, wherein said emitter zones have a comb shape with teeth-like portions extending perpendicularly away from at least part of said lateral portion, said shorting means extending between said teeth-like portions and in parallel thereto.

4. The semiconductor device according to claim 1, wherein said shorting means are arranged adjacent to both of said first and second main electrode members, said shorting means having a congruent shape and being arranged in register with each other.

5. The semiconductor device according to claim 1, wherein one of said main electrode members comprises a central aperture therein, said semiconductor zones comprising an emitter annulus of given conductivity type and having a central region therein, said aperture and region being arranged concentrically relative to each other, a zone of a conductivity type opposite to said given conductivity type and located centrally in said aperture and said region in register with said gate electrode so that said emitter annulus surrounds the gate electrode, said emitter annulus having radially outwardly extending narrow slots therein, said narrow strip shorting means extending through said slots into galvanic contact with said one main electrode member.

6. The semiconductor device according to claim 5, wherein said zone under said gate electrode has a serated periphery formed by a plurality of radially outwardly pointing teeth with spaces therebetween, wherein said emitter annulus has an inner serated edge formed by radially inwardly pointing teeth also with spaces therebetween, and bounding said central region in said annulus, and wherein said radially inwardly and outwardly pointing teeth are arranged radially opposite each other, said spaces between said teeth also being arranged radially opposite each other, whereby said spaces are radially aligned with said narrow strip shorting means in said slots, and whereby said teeth are radially aligned with lands of said emitter annulus extending between said slots.

7. The semiconductor device according to claim 6, wherein said emitter annulus comprises a peripheral zone with further slots therein also extending radially outwardly and intermediate said first mentioned slots, said further slots being shorter than said first mentioned slots, said narrow strip shorting also extending through said further slots into galvanic contact with said one electrode member.

8. The semiconductor device according to claim 7, wherein said one electrode member comprises first and second ridges on an outer surface thereof, said ridges extending radially inwardly toward said central aperture, said ridges being located to register with first mentioned slots and said further slots in said emitter annulus.

9. The semiconductor device according to claim 5, wherein said emitter annulus has a given width, and wherein said slots are shorter than said given width whereby an inner emitter ring zone is formed which separates said gate electrode from inner ends of said narrow strip shorting means in said slots.

10. The semiconductor device according to claim 1, wherein valley bottoms have a thickness which provides a small transversal electrical resistance.

11. The semiconductor device according to claim 1, further comprising terminal means and means for directly connecting said electrode ridges to said terminal means.

12. The semiconductor device according to claim 11, wherein said main electrode means comprise means for containing a coolant which evaporates at the operating temperature of said semiconductor device.

13. The semiconductor device according to claim 11, wherein said main electrode means comprise a capillary coating on its surface opposite said semiconductor means, said capillary coating extending into areas where evaporated coolant condenses again whereby the coolant is recirculated as in a heat pipe.

14. The semiconductor device according to claim 13, wherein said capillary coating comprises a layer of capillary tungsten deposited from a tungsten vapor phase.

* * * * *